US012754593B2

(12) United States Patent
Escamilla et al.

(10) Patent No.: US 12,754,593 B2
(45) Date of Patent: Oct. 6, 2026

(54) SYSTEMS AND METHODS FOR RETENTION OF RISER ASSEMBLIES

(71) Applicant: Dell Products L.P., Round Rock, TX (US)

(72) Inventors: Eduardo Escamilla, Round Rock, TX (US); Juan Gonzalez, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 614 days.

(21) Appl. No.: 18/313,648

(22) Filed: May 8, 2023

(65) Prior Publication Data

US 2024/0377863 A1 Nov. 14, 2024

(51) Int. Cl.
*G06F 1/18* (2026.01)
*H05K 5/02* (2006.01)

(52) U.S. Cl.
CPC ........... *G06F 1/181* (2013.01); *H05K 5/0221* (2013.01)

(58) Field of Classification Search
CPC ....... G06F 1/181; G06F 1/185; H05K 5/0221; H05K 7/1487
See application file for complete search history.

(56) References Cited

U.S. PATENT DOCUMENTS

| | | | | |
|---|---|---|---|---|
| 8,054,632 | B2 * | 11/2011 | Regimbal | H05K 7/1489 361/679.33 |
| 10,890,956 | B1 * | 1/2021 | Henderson | G06F 1/206 |
| 2021/0373616 | A1 * | 12/2021 | Chen | G06F 1/185 |
| 2024/0176398 | A1 * | 5/2024 | Tsorng | G06F 13/4022 |
| 2024/0365499 | A1 * | 10/2024 | Nguyen | H05K 7/18 |

* cited by examiner

*Primary Examiner* — Imani N Hayman
(74) *Attorney, Agent, or Firm* — Jackson Walker L.L.P.

(57) ABSTRACT

A rotating latch of an information handling resource assembly may be movable between a closed position in which a first engagement feature is configured to engage with a corresponding first mechanical feature of a second information handling resource assembly having a second edge connector configured to mechanically and electrically couple to a second receptacle connector formed on a circuit board in order to mechanically maintain the second information handling resource assembly in a fixed position relative to the information handling resource assembly and further in which a second engagement feature is configured to engage with a second mechanical feature of the chassis in order to mechanically maintain the first information handling resource assembly in a fixed position relative to the chassis and an open position in which the first engagement feature is disengaged from the first mechanical feature and the second engagement feature is disengaged from the second mechanical feature.

21 Claims, 7 Drawing Sheets

SYSTEMS AND METHODS FOR RETENTION OF RISER ASSEMBLIES

TECHNICAL FIELD

The present disclosure relates in general to information handling systems, and more particularly to systems and methods for retention of a riser assembly in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems utilize one or more riser cards. A riser card is a printed circuit board that gives a motherboard of the information handling system the option for additional expansion cards to be added to the information handling system. Thus, a riser card is usually coupled to a motherboard receptacle connector via an edge connector, and may include one or more receptacle connectors mounted on the riser card to receive expansion cards in order to electrically couple such expansion cards to the motherboard. Accordingly, in general, the main purpose of a riser card may be to change the orientation of the expansion cards such that they fit a limited space within casing.

In order to provide mechanical structure for the riser card, its connectors, and expansion cards coupled to the riser card, a riser mechanical assembly may be used to house the riser card, its connectors, and expansion cards coupled to the riser card, and may also include mechanical features to mechanically retain the edge connector of the riser card within the receptacle connector of the motherboard. In order to maintain functionality, such mechanical components must provide sufficient structure to maintain electrical connectivity between expansion cards and the riser card, and between the riser card and the motherboard, including preventing cards from being unseated from their respective connectors due to vibration or other mechanical stress.

SUMMARY

In accordance with the teachings of the present disclosure, the disadvantages and problems associated with existing approaches to mechanical and electrical coupling between an information handling resource and a circuit board 5 may be reduced or eliminated.

In accordance with embodiments of the present disclosure, an information handling system may include a chassis, a first information handling resource assembly comprising a first housing for carrying a first information handling resource having a first edge connector configured to mechanically and electrically couple to a first receptacle connector formed on a circuit board, and a second information handling resource assembly. The second information handling resource assembly may comprise a second housing for carrying a second information handling resource having a second edge connector configured to mechanically and electrically couple to a second receptacle connector formed on the circuit board and a rotating latch rotatably coupled to the housing via an axis substantially perpendicular to a surface of the circuit board, the rotating latch comprising a body, a first engagement feature extending from the body in a direction substantially parallel to the surface of the circuit board, and a second engagement feature. The rotating latch may be movable between a closed position in which the first engagement feature engages with a corresponding first mechanical feature of the first housing in order to mechanically maintain the first information handling resource assembly in a fixed position relative to the second information handling resource assembly and further in which the second engagement feature engages with a second mechanical feature of the chassis in order to mechanically maintain the first information handling resource assembly in a fixed position relative to the chassis and an open position in which the first engagement feature is disengaged from the first mechanical feature and the second engagement feature is disengaged from the second mechanical feature.

In accordance with these and other embodiments of the present disclosure, an information handling resource assembly may include a first housing for carrying a first information handling resource having a first edge connector configured to mechanically and electrically couple to a first receptacle connector formed on the circuit board and a rotating latch rotatably coupled to the housing via an axis substantially perpendicular to a surface of the circuit board when the first edge connector is coupled to the receptacle connector. The rotating latch may include a body, a first engagement feature extending from the body in a direction substantially parallel to the surface of the circuit board when the first edge connector is coupled to the receptacle connector, and a second engagement feature. The rotating latch may be movable between a closed position in which the first engagement feature is configured to engage with a corresponding first mechanical feature of a second information handling resource assembly having a second edge connector configured to mechanically and electrically couple to a second receptacle connector formed on the circuit board in order to mechanically maintain the second information handling resource assembly in a fixed position relative to the information handling resource assembly and further in which the second engagement feature is configured to engage with a second mechanical feature of the chassis in order to mechanically maintain the first information handling resource assembly in a fixed position relative to the chassis and an open position in which the first engagement feature is disengaged from the first mechanical feature and the second engagement feature is disengaged from the second mechanical feature.

In accordance with these and other embodiments of the present disclosure, a method for constructing an information handling resource assembly may include rotatably coupling, via an axis, a rotating latch to a first housing for carrying a first information handling resource having a first edge connector configured to mechanically and electrically couple to a first receptacle connector formed on the circuit board, wherein the axis is substantially perpendicular to a surface of the circuit board when the first edge connector is coupled to the receptacle connector, wherein the rotating latch comprises a body a first engagement feature extending from the body in a direction substantially parallel to the surface of the circuit board when the first edge connector is coupled to the receptacle connector, and a second engagement feature. The rotating latch may be movable between a closed position in which the first engagement feature is configured to engage with a corresponding first mechanical feature of a second information handling resource assembly having a second edge connector configured to mechanically and electrically couple to a second receptacle connector formed on the circuit board in order to mechanically maintain the second information handling resource assembly in a fixed position relative to the information handling resource assembly and further in which the second engagement feature is configured to engage with a second mechanical feature of the chassis in order to mechanically maintain the first information handling resource assembly in a fixed position relative to the chassis and an open position in which the first engagement feature is disengaged from the first mechanical feature and the second engagement feature is disengaged from the second mechanical feature.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
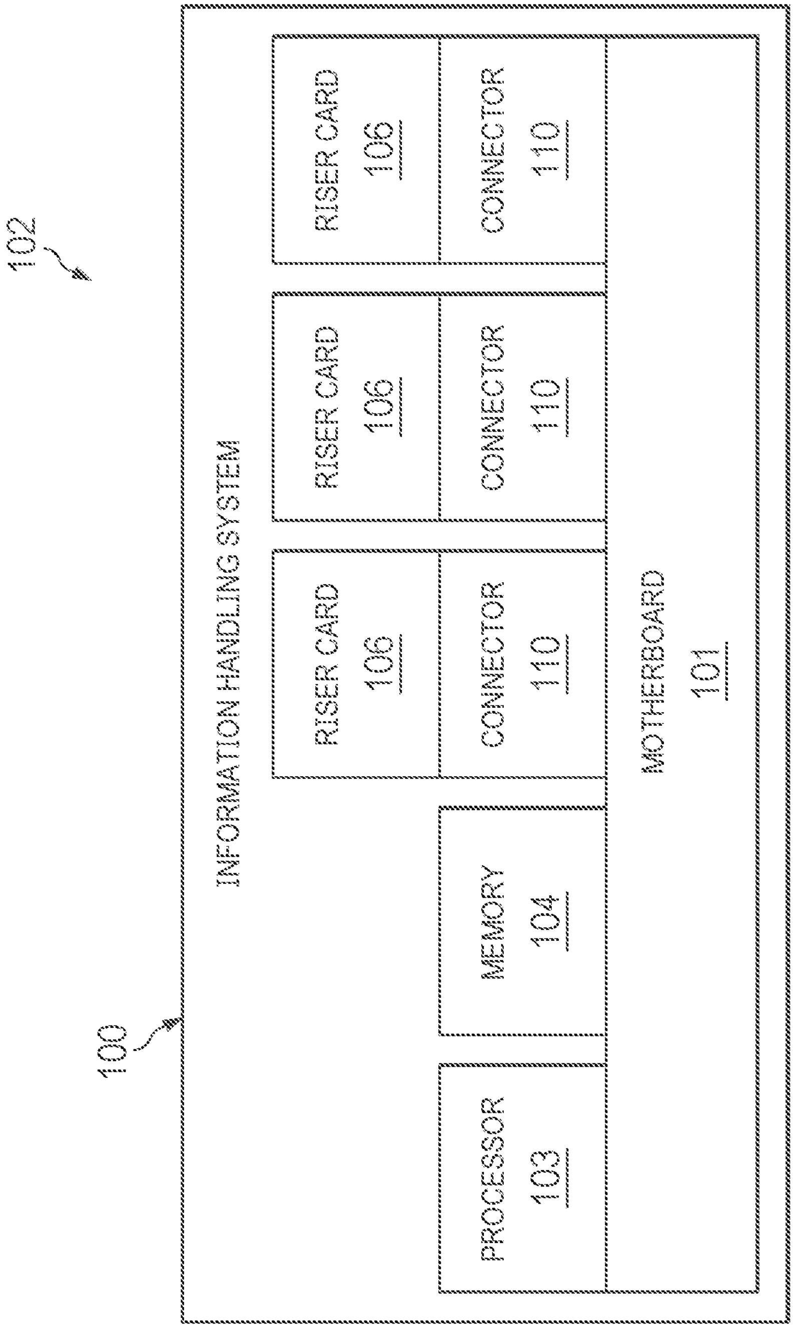
FIG. 1 illustrates a block diagram of selected components of an example information handling system, in accordance with embodiments of the present disclosure.

Preferred embodiments and their advantages are best understood by reference to FIGS. 1 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one more one or storage devices, or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a chassis 100 that houses a motherboard 101, a processor 103 coupled to motherboard 101, a memory 104 coupled to motherboard 101, a connector 110 mechanically and electrically coupled to motherboard 101, and a plurality of riser cards 106 electrically coupled to motherboard 101 via respective connectors 110.

Chassis 100 may include any suitable housing or enclosure configured to house the various components of information handling system 102, and may be constructed from metal, plastic, and/or any other suitable material.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

A connector 110 may comprise any system, device, or apparatus fixedly mounted on motherboard 101 and may be constructed to mechanically couple a corresponding riser card 106 to motherboard 101 and to electrically couple such riser card 106 to motherboard 101, processor 103, and/or other components of information handling system 102. Connector 110 may comprise a socket including a receptacle slot or other opening configured to removably receive a corresponding mating edge connector of riser card 106.

A riser card 106 may comprise a circuit board enabling the option for additional expansion cards to be coupled to motherboard 101. Riser card 106 may be coupled to connector 110 via an edge connector (not explicitly shown in FIG. 1), and may include one or more receptacle connectors mounted (not explicitly shown in FIG. 1) on riser card 106 to receive expansion cards in order to electrically couple such expansion cards to motherboard 101.

In addition to motherboard 101, processor 103, memory 104, riser cards 106, and connectors 110, information handling system 102 may include one or more other information handling resources.

Figure 2:
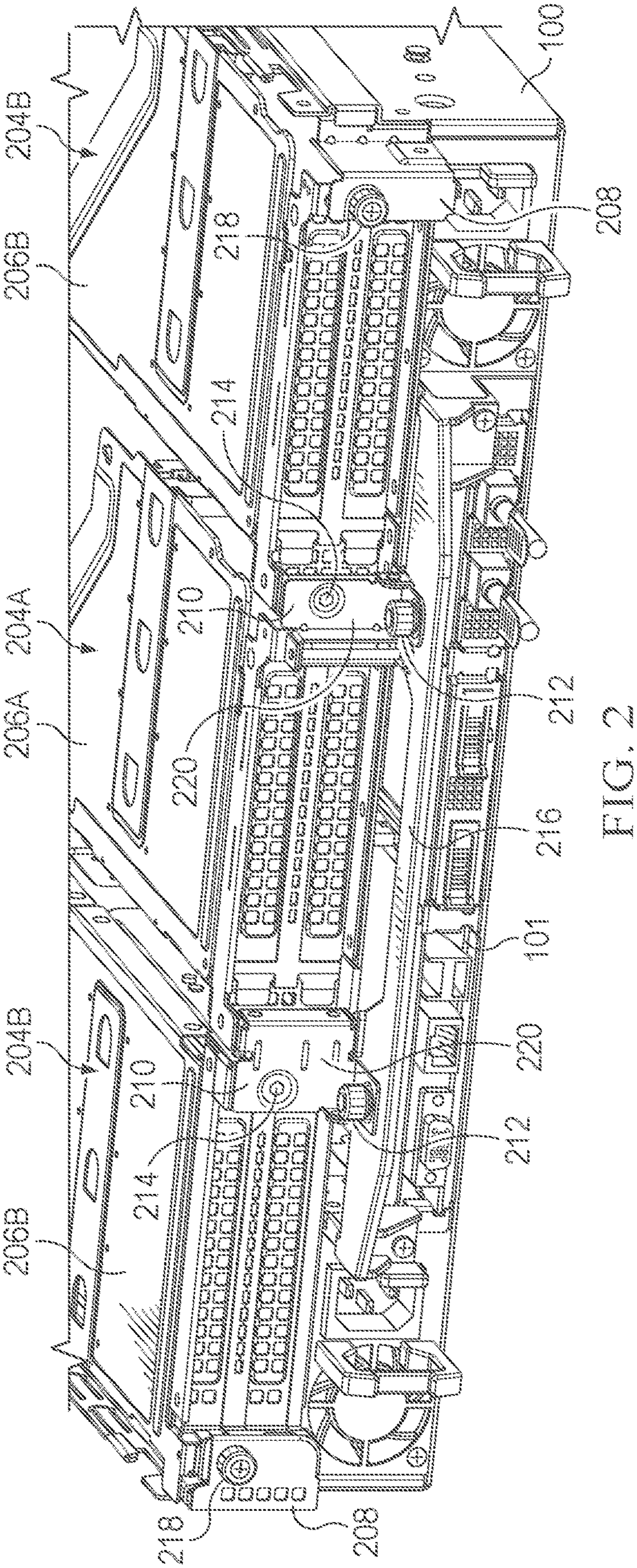
FIG. 2 illustrates a perspective view of selected components of the example information handling system of FIG. 1, in accordance with embodiments of the present disclosure.

FIG. 2 illustrates a perspective view of selected components of example information handling system 102, in accordance with embodiments of the present disclosure. As shown in FIG. 2, chassis 100 may house motherboard 101, which may be mechanically mounted to chassis 100 in any suitable manner, including via screws, brackets, and/or other fastening features, Chassis 100 may also house a plurality of riser assemblies 204 (e.g., riser assemblies 204A and 204B), and other components of information handling system 102.

As shown in FIG. 2, in some embodiments, riser assemblies 204 may be arranged with chassis 100 with a center riser assembly 204A mechanically mounted above motherboard 101 and lateral riser assemblies 204B on either side of center riser assembly 204A. Each riser assembly 204 may include a housing 206 (e.g., housing 206A or 206B) configured to house one or more riser cards 106 (not explicitly shown in FIG. 2), connectors 110 of such one or more riser card 106, and any expansion cards coupled to each riser card 106 (also not explicitly shown in FIG. 2).

Each lateral riser assembly 204B may be mechanically coupled to chassis 100 via a bracket 208 mechanically affixed to chassis 100 via a fastener 218 (e.g., a thumbscrew), such that bracket 208 provides mechanical structure configured to at least partially maintain the lateral riser assembly 204B in a fixed position relative to chassis 100.

As also depicted in FIG. 2, and described in greater detail below, center riser assembly 204A may include rotating latches 210 mechanically coupled to housing 206A via a rotational axis, wherein such rotational axis is substantially perpendicular to the surface of motherboard 101. Each rotating latch 210 may include a body 220 mechanically coupled to housing 206A via the rotational axis, and a fastener 212 (e.g., a thumbscrew) configured to mechanically engage body 220 to a mounting feature 216 of chassis 100 such that an axis of fastener 212 is substantially perpendicular to the surface of motherboard 101 to at least partially mechanically restrain center riser assembly 204A relative to chassis 100. Each rotating latch 210 may also include an engagement feature 214 configured to mechanically engage with a corresponding engagement feature of a housing 206B, as described in greater detail below, thus further mechanically constraining such housing 206B relative to chassis 100.

Figure 3:
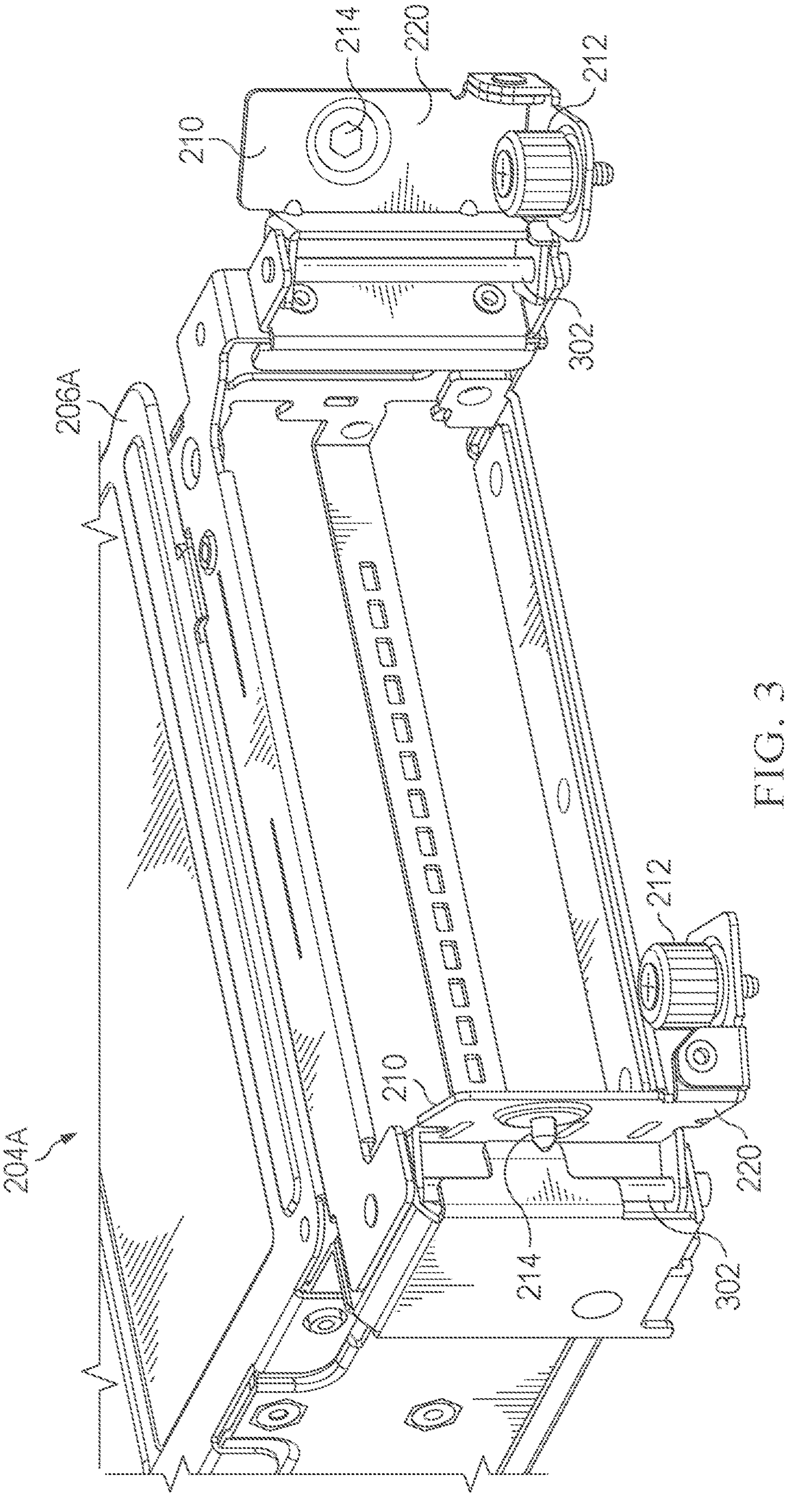
FIG. 3 illustrates a detailed perspective view of selected components of a riser assembly, in accordance with embodiments of the present disclosure.

FIG. 3 illustrates a detailed perspective view of selected components of center riser assembly 204A, in accordance with embodiments of the present disclosure. For example, FIG. 3 illustrates detail of housing 206A, rotational latches 210 mechanically coupled to housing 206A via respective axes 302, with each rotating latch 210 having body 220, fastener 212, and engagement feature 214 formed within body 220.

Figure 4A:
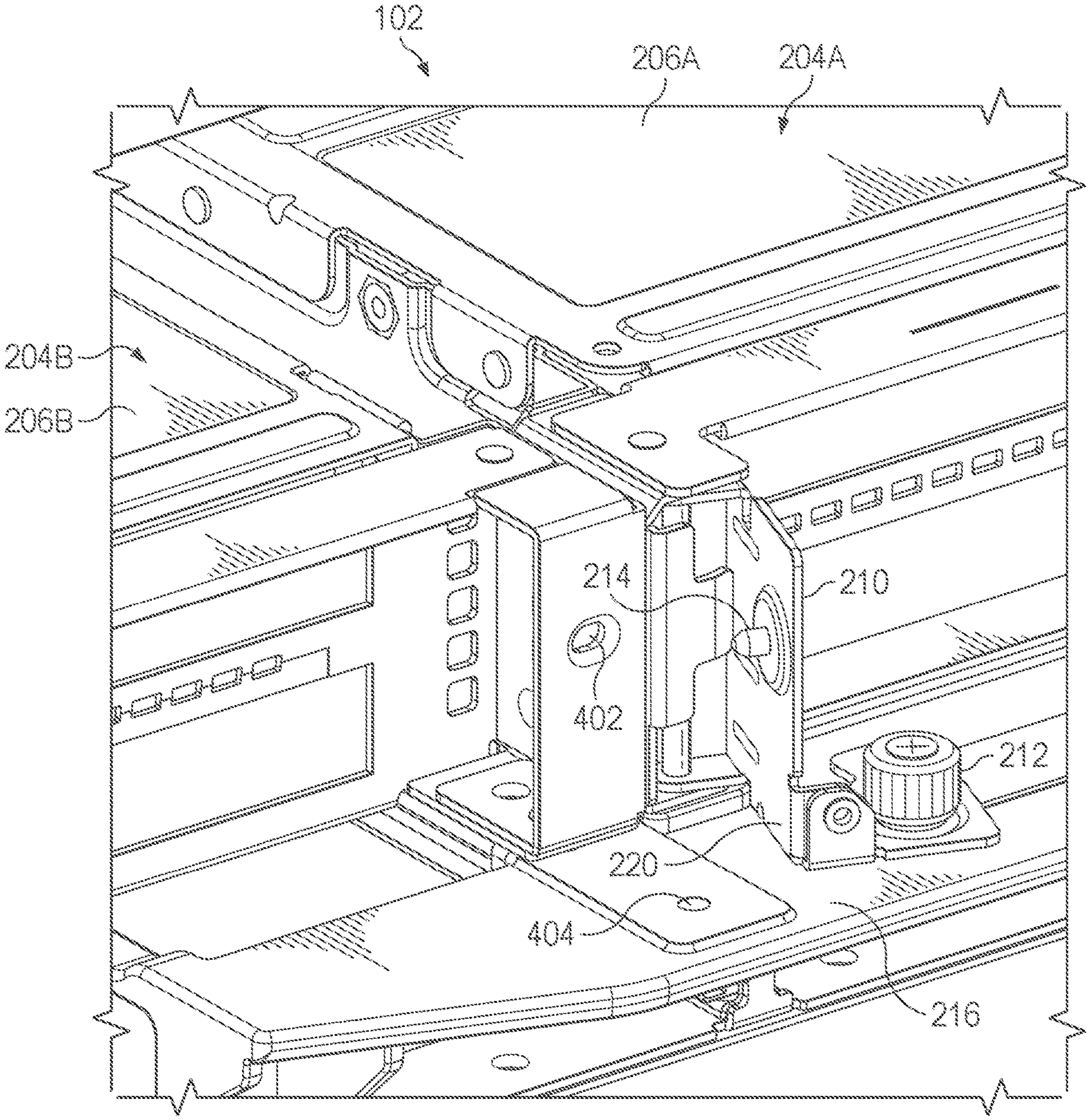
FIG. 4A illustrates a detailed perspective view of selected components of the example information handling system of FIG. 1, with a rotating latch in an open position, in accordance with embodiments of the present disclosure.
Figure 4B:
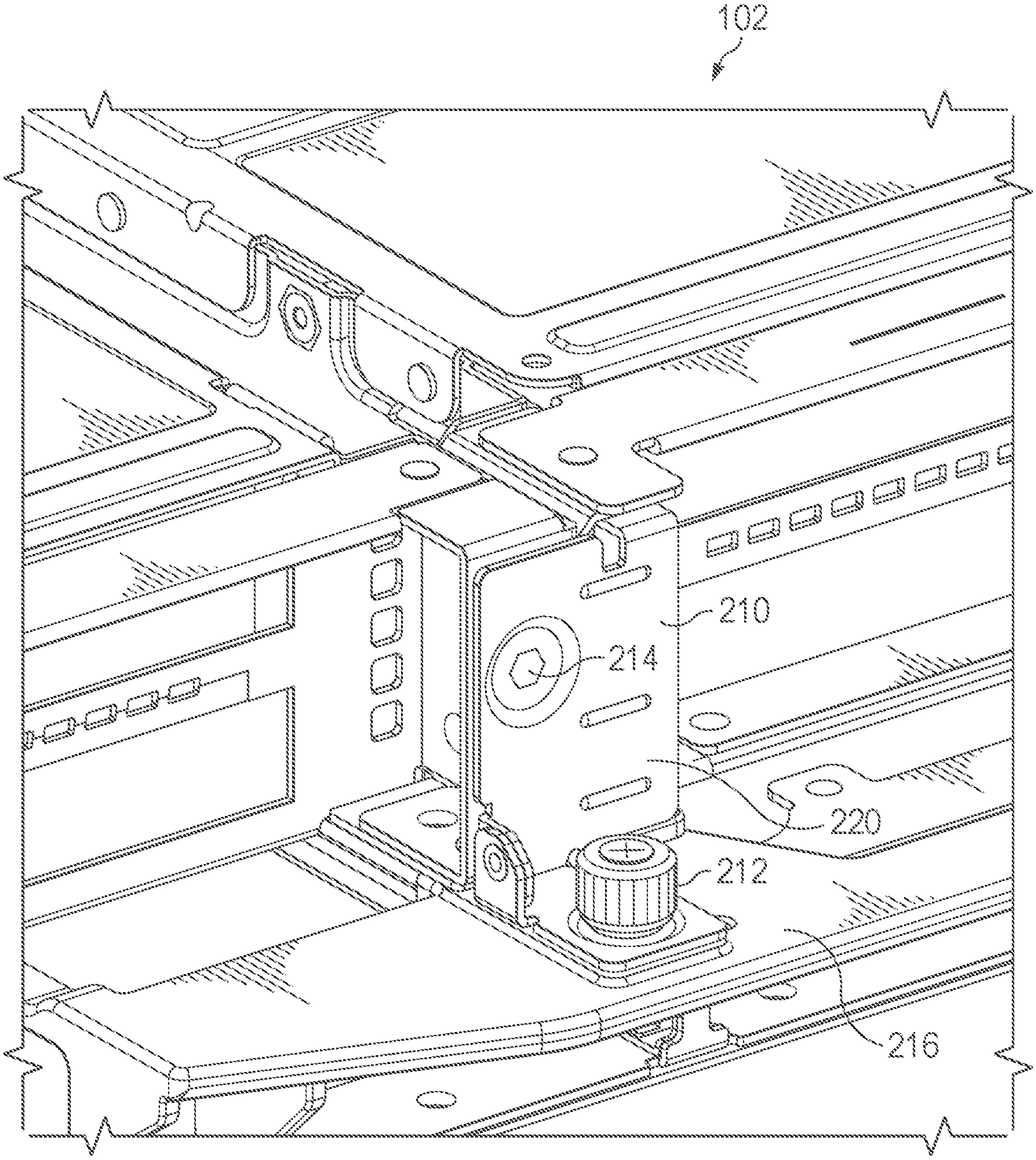
FIG. 4B illustrates a detailed perspective view of selected components of the example information handling system of FIG. 1, with a rotating latch in a closed position, in accordance with embodiments of the present disclosure.

FIG. 4A illustrates a detailed perspective view of selected components of example information handling system 102, with a rotating latch 210 in an open position relative to center riser assembly 204A, in accordance with embodiments of the present disclosure. Similarly, FIG. 4B illustrates a detailed perspective view of selected components of information handling system 102, with a rotating latch 210 in a closed position relative to center riser assembly 204A, in accordance with embodiments of the present disclosure. With rotating latch 210 in the open position, a person (e.g., a user or technician) may also disengage a fastener 218 and a bracket 208 from chassis 100 in order to service or remove a lateral riser assembly 204B from chassis 100. Further, with rotating latch 210 in the open position, a person may also manipulate the other rotating latch 210 into an open position relative to center riser assembly 204A in order to service or remove such center riser assembly 204A from chassis 100. As described above, with rotating latch 210 in the closed position, rotating latch 210 may at least partially mechanically retain center riser assembly 204A and a lateral riser assembly 204B relative to chassis 100.

To manipulate rotating latch 210 from the open position to the closed position, a person may apply a mechanical force to rotating latch 210 to cause rotation of rotating latch 210 relative to chassis 100 such that fastener 212 aligns with an opening 404 or other mechanical feature of mounting feature 216 of chassis 100 and such that engagement feature 214 mechanically engages with an opening 402 or other mechanical feature of housing 206B of lateral riser assembly 204B. Once so aligned and engaged, the person may cause fastener 212 to mechanically engage with opening 404 (e.g., in embodiments in which fastener 212 is a thumbscrew, rotating such thumbscrew so that threads of the thumbscrew engage with corresponding features of opening 404 to retain fastener 212 within opening 404).

Similarly, to manipulate rotating latch 210 from the closed position to the open position, a person may disengage fastener 212 from opening 404, and apply a mechanical force to rotating latch 210 to cause rotation of rotating latch 210 relative to chassis 100 to translate rotating latch 210 to the open position.

Although FIGS. 3, 4A, and 4B depict engagement feature 214 as a lock pin configured to engage with an opening 404 formed in housing 206B, it is understood that engagement feature 214 and its corresponding feature of housing 206B may comprise any mechanical features for mechanically retaining a lateral riser assembly 204B relative to center riser assembly 204A. For example, engagement feature 214 may include any convex structure extending from body 220 while the corresponding mechanical feature formed in housing 206B may comprise any suitable opening or concave structure formed in housing 206B.

Figure 5:
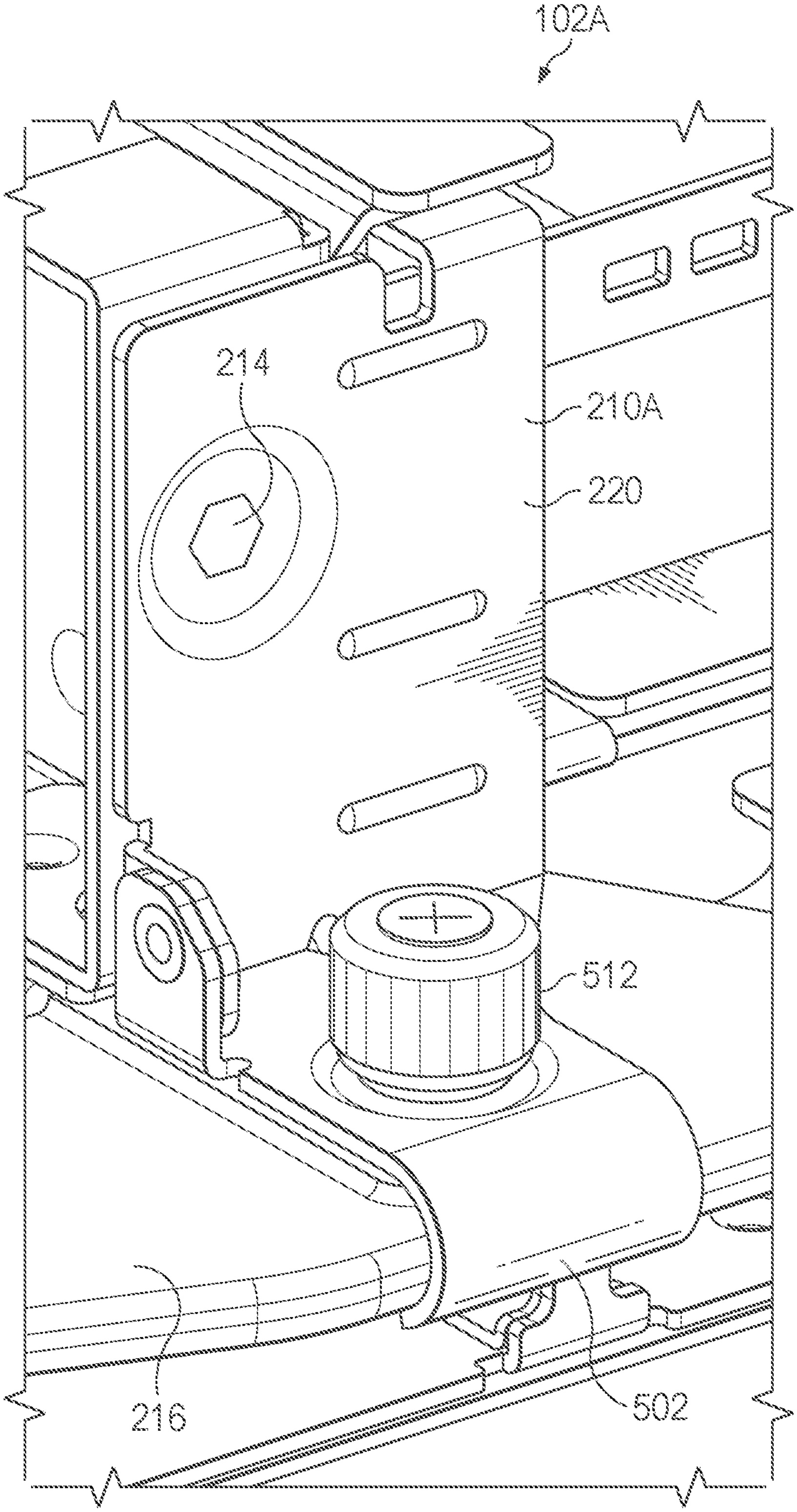
FIG. 5 illustrates a detailed perspective view of selected components of another example information handling system having an alternative rotating latch, in accordance with embodiments of the present disclosure.

FIG. 5 illustrates a detailed perspective view of selected components of another example information handling system 102A having a rotating latch 210A, in accordance with embodiments of the present disclosure. Information handling system 102A may be similar in many respects to information handling system 102 described above, with the exception of having rotating latches 210A in lieu of rotating latches 210. A rotating latch 210A may be similar in many respects to rotating latch 210 described above, with the exception of rotating latch 210A having a spring-loaded lock pin 512 in lieu of fastener 212 such that spring-loaded lock pin 512 may engage with opening 404 formed within mounting feature 216 of chassis 100. Further, rotating latch 210A may have a curved flange 502 configured to contour around and further mechanically engage with mounting feature 216 in order to mechanically restrain rotating latch 210A relative to body 220 when rotating latch 210A is in the closed position.

Figure 6:
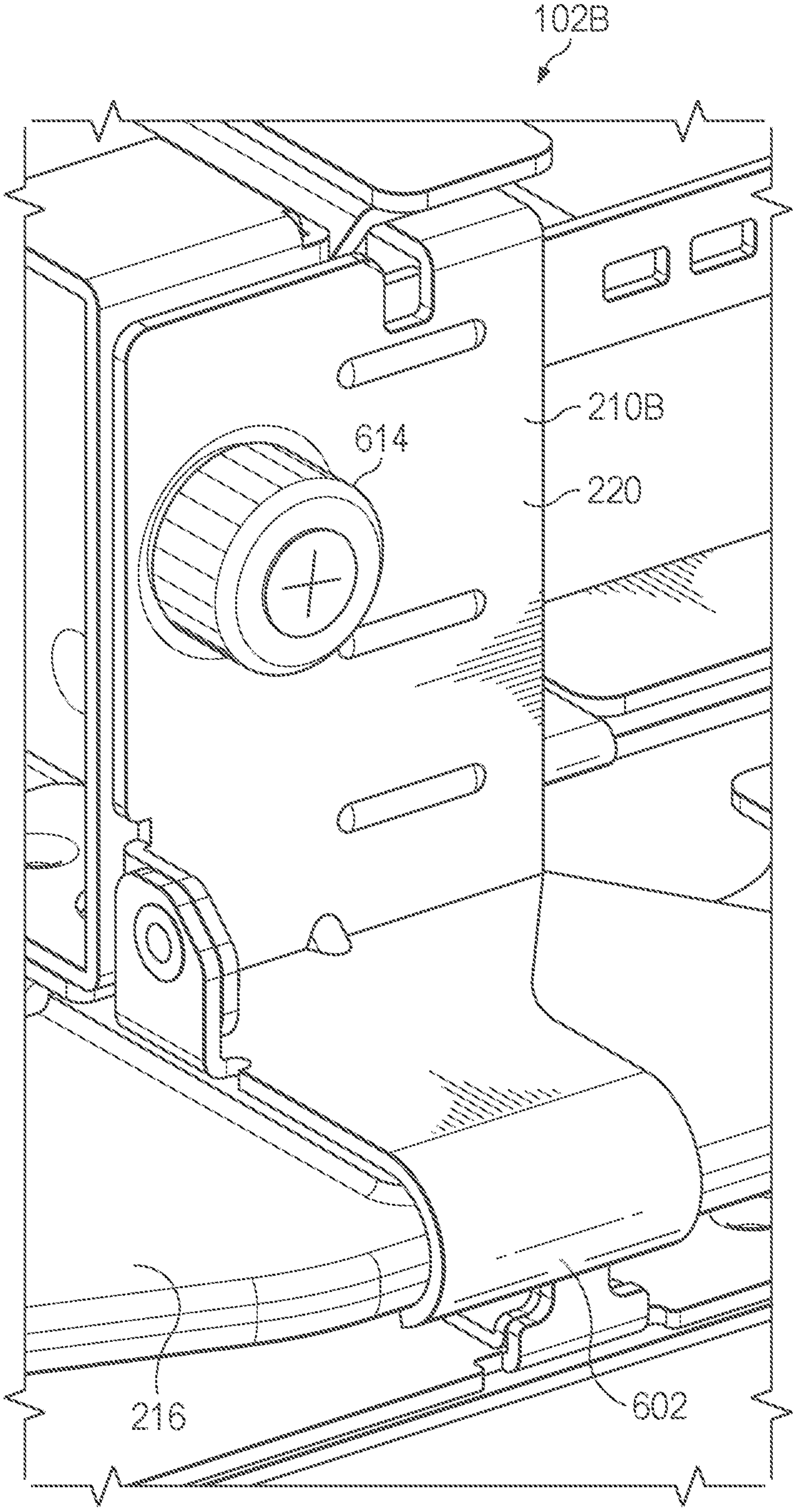
FIG. 6 illustrates a detailed perspective view of selected components of another example information handling system having another alternative rotating latch, in accordance with embodiments of the present disclosure.

FIG. 6 illustrates a detailed perspective view of selected components of another example information handling system 102B having a rotating latch 210B, in accordance with embodiments of the present disclosure. Information handling system 102B may be similar in many respects to information handling system 102 described above, with the exception of having rotating latches 210B in lieu of rotating latches 210. A rotating latch 210B may be similar in many respects to rotating latch 210 described above, with the exception that rotating latch may include a fastener 614 in lieu of engagement feature 214 and configured to mechanically engage with opening 402 or another mechanical feature of housing 206B of lateral riser assembly 204B. Further, rotating latch 210B may not include fastener 212. In addition, rotating latch 210B may have a curved flange 602 configured to contour around and further mechanically engage with mounting feature 216 in order to mechanically restrain rotating latch 210B relative to body 220 when rotating latch 210B is in the closed position.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
- a chassis;
- a first information handling resource assembly comprising a first housing for carrying a first information handling resource having a first edge connector configured to mechanically and electrically couple to a first receptacle connector formed on a circuit board; and
- a second information handling resource assembly comprising:
  - a second housing for carrying a second information handling resource having a second edge connector configured to mechanically and electrically couple to a second receptacle connector formed on the circuit board; and
  - a rotating latch rotatably coupled to the second housing via an axis substantially perpendicular to a surface of the circuit board, the rotating latch comprising:
    - a body;
    - a first engagement feature extending from the body in a direction substantially parallel to the surface of the circuit board; and
    - a second engagement feature;
- wherein the rotating latch is movable between:
  - a closed position in which the first engagement feature engages with a corresponding first mechanical feature of the first housing in order to mechanically maintain the first information handling resource assembly in a fixed position relative to the second information handling resource assembly and further in which the second engagement feature engages with a second mechanical feature of the chassis in order to mechanically maintain the first information handling resource assembly in a fixed position relative to the chassis; and
  - an open position in which the first engagement feature is disengaged from the first mechanical feature and the second engagement feature is disengaged from the second mechanical feature.

2. The information handling system of claim 1, wherein the first information handling resource comprises a riser card.

3. The information handling system of claim 1, wherein the second information handling resource comprises a riser card.

4. The information handling system of claim 1, wherein the circuit board comprises a motherboard.

5. The information handling system of claim 1, wherein:
- the first engagement feature comprises a pin extending from the body and configured to engage with the first mechanical feature; and
- the second engagement feature comprises a fastener configured to engage with the second mechanical feature.

6. The information handling system of claim 1, wherein:
- the first engagement feature comprises a pin extending from the body and configured to engage with the first mechanical feature; and
- the second engagement feature comprises a spring-loaded lock pin configured to engage with the second mechanical feature.

7. The information handling system of claim 1, wherein:
- the first engagement feature comprises a fastener configured to engage with the first mechanical feature; and
- the second engagement feature comprises a curved flange configured to contour around and to engage with the second mechanical feature.

8. An information handling resource assembly comprising:
- a first housing for carrying a first information handling resource having a first edge connector configured to mechanically and electrically couple to a first receptacle connector formed on a circuit board; and
- a rotating latch rotatably coupled to the housing via an axis substantially perpendicular to a surface of the circuit board when the first edge connector is coupled to the receptacle connector, the rotating latch comprising:
  - a body;
  - a first engagement feature extending from the body in a direction substantially parallel to the surface of the circuit board when the first edge connector is coupled to the receptacle connector; and
  - a second engagement feature;
- wherein the rotating latch is movable between:
  - a closed position in which the first engagement feature is configured to engage with a corresponding first mechanical feature of a second information handling resource assembly having a second edge connector configured to mechanically and electrically couple to a second receptacle connector formed on the circuit board in order to mechanically maintain the second information handling resource assembly in a fixed position relative to the information handling resource assembly and further in which the second engagement feature is configured to engage with a second mechanical feature of the chassis in order to mechanically maintain the first information handling resource assembly in a fixed position relative to the chassis; and
  - an open position in which the first engagement feature is disengaged from the first mechanical feature and the second engagement feature is disengaged from the second mechanical feature.

9. The information handling resource assembly of claim 8, wherein the first information handling resource comprises a riser card.

10. The information handling resource assembly of claim 8, wherein the second information handling resource comprises a riser card.

11. The information handling resource assembly of claim 8, wherein the circuit board comprises a motherboard.

12. The information handling resource assembly of claim 8, wherein:
- the first engagement feature comprises a pin extending from the body and configured to engage with the first mechanical feature; and
- the second engagement feature comprises a fastener configured to engage with the second mechanical feature.

13. The information handling resource assembly of claim 8, wherein:

the first engagement feature comprises a pin extending from the body and configured to engage with the first mechanical feature; and the second engagement feature comprises a spring-loaded lock pin configured to engage with the second mechanical feature.

14. The information handling resource assembly of claim 8, wherein:

the first engagement feature comprises a fastener configured to engage with the first mechanical feature; and the second engagement feature comprises a curved flange configured to contour around and to engage with the second mechanical feature.

15. A method for constructing an information handling resource assembly comprising:

rotatably coupling, via an axis, a rotating latch to a first housing for carrying a first information handling resource having a first edge connector configured to mechanically and electrically couple to a first receptacle connector formed on the circuit board, wherein the axis is substantially perpendicular to a surface of a circuit board when the first edge connector is coupled to the receptacle connector, wherein the rotating latch comprises:

a body;

a first engagement feature extending from the body in a direction substantially parallel to the surface of the circuit board when the first edge connector is coupled to the receptacle connector; and a second engagement feature;

wherein the rotating latch is movable between:

a closed position in which the first engagement feature is configured to engage with a corresponding first mechanical feature of a second information handling resource assembly having a second edge connector configured to mechanically and electrically couple to a second receptacle connector formed on the circuit board in order to mechanically maintain the second information handling resource assembly in a fixed position relative to the information handling resource assembly and further in which the second engagement feature is configured to engage with a second mechanical feature of the chassis in order to mechanically maintain the first information handling resource assembly in a fixed position relative to the chassis; and an open position in which the first engagement feature is disengaged from the first mechanical feature and the second engagement feature is disengaged from the second mechanical feature.

16. The method of claim 15, wherein the first information handling resource comprises a riser card.

17. The method of claim 15, wherein the second information handling resource comprises a riser card.

18. The method of claim 15, wherein the circuit board comprises a motherboard.

19. The method of claim 15, wherein:

the first engagement feature comprises a pin extending from the body and configured to engage with the first mechanical feature; and the second engagement feature comprises a fastener configured to engage with the second mechanical feature.

20. The method of claim 15, wherein:

the first engagement feature comprises a pin extending from the body and configured to engage with the first mechanical feature; and the second engagement feature comprises a spring-loaded lock pin configured to engage with the second mechanical feature.

21. The method of claim 15, wherein:

the first engagement feature comprises a fastener configured to engage with the first mechanical feature; and the second engagement feature comprises a curved flange configured to contour around and to engage with the second mechanical feature.

* * * * *